(12) United States Patent
Marksteiner et al.

(10) Patent No.: US 6,933,807 B2
(45) Date of Patent: Aug. 23, 2005

(54) ACOUSTIC REFLECTOR FOR A BAW RESONATOR PROVIDING SPECIFIED REFLECTION OF BOTH SHEAR WAVES AND LONGITUDINAL WAVES

(75) Inventors: Stephan Marksteiner, Neubiberg (DE); Gernot Fattinger, München (DE); Robert Aigner, München (DE); Jyrki Kaitila, Helsinki (FI)

(73) Assignee: Infineon Technologies AG, Munich (DE)

( * ) Notice: Subject to any disclaimer, the term of this patent is extended or adjusted under 35 U.S.C. 154(b) by 36 days.

(21) Appl. No.: 10/704,260

(22) Filed: Nov. 7, 2003

(65) Prior Publication Data

US 2004/0140869 A1 Jul. 22, 2004

(30) Foreign Application Priority Data

Nov. 7, 2002 (DE) ............................... 102 51 876

(51) Int. Cl.[7] .......................... H03H 9/56; H03H 9/05; H03H 9/15
(52) U.S. Cl. ........................ 333/187; 333/189; 333/191; 310/335
(58) Field of Search ............................... 333/186–192; 310/335

(56) References Cited

U.S. PATENT DOCUMENTS

| 5,873,154 A | 2/1999 | Ylilammi et al. ......... 29/25.35 |
| 6,448,695 B2 | 9/2002 | Milsom ..................... 310/334 |
| 6,812,619 B1 * | 11/2004 | Kaitila et al. ............... 310/320 |

FOREIGN PATENT DOCUMENTS

| DE | 693 26 880 T2 | 8/1994 |
| EP | 0 609 555 A2 | 8/1994 |
| WO | 01/06647 A1 | 1/2001 |

OTHER PUBLICATIONS

Michael J. S. Lowe: "Matrix Techniques for Modeling Ultrasonic Waves in Multilayered Media", *IEEE Transactions on Ultrasonics, Ferroelectrics, and Frequency Control*, vol. 42, No. 4, Jul. 1995, pp. 525–541.

* cited by examiner

*Primary Examiner*—Barbara Summons
(74) *Attorney, Agent, or Firm*—Laurence A. Greenberg; Werner H. Stemer; Ralph E. Locher (57) ABSTRACT

A BAW resonator includes a piezoelectric layer, a first electrode, a second electrode, a substrate, and an acoustic reflector disposed between the substrate and the second electrode. The acoustic reflector has a plurality of layers. A performance of the acoustic reflector is determined by its reflectivity for a longitudinal wave existing in the BAW resonator at the resonance frequency of the BAW resonator and by its reflectivity for a shear wave existing in the BAW resonator at the resonance frequency of the BAW resonator. The layers of the acoustic reflector and layers disposed between the acoustic reflector and the piezoelectric layer are selected, with reference to their number, material, and thickness, such that the transmissivity for the longitudinal wave and the transmissivity for the shear wave in the area of the resonance frequency is smaller than −10 dB.

11 Claims, 9 Drawing Sheets

ACOUSTIC REFLECTOR FOR A BAW RESONATOR PROVIDING SPECIFIED REFLECTION OF BOTH SHEAR WAVES AND LONGITUDINAL WAVES

BACKGROUND OF THE INVENTION

1. Field of the Invention

The present invention relates to an acoustic reflector (acoustic mirror) for a BAW resonator (BAW=bulk acoustic wave), and here in particular to an acoustic reflector with a plurality of layers for an improved performance of the BAW resonator.

2. Description of the Related Art

The present invention preferably involves BAW filters for RF applications, and here in particular BAW filters for RF applications in which excellent selectivity and steep transition bands are required. In such filters, the most critical parameters are the quality factor and the coupling coefficient of the BAW resonators. The coupling coefficient is defined by the frequencies at which series resonance and parallel resonance occur. The coupling coefficient is a function of the electromechancial coupling of the piezoelectric layer of the BAW resonator as well as the thickness and types of materials uses in the overall arrangement of the BAW resonator having a plurality of layers to form a layer stack. With respect to the above-mentioned series resonance and parallel resonance, it should be understood that hereby the electrical resonance performance of a BAW resonator is to be understood, i.e. a series resonance corresponds to the impedance minimum and the parallel resonance to the impedance maximum of the frequency-dependent characteristic impedance curve of the resonator.

The quality is defined by the relative energy loss in the BAW resonator. The energy loss is either based on the leaking of acoustic signals, which is also referred to as acoustic leakage, electrical effects, or viscous losses (damping) of the acoustic waves in the layer stack.

Figure 1A:
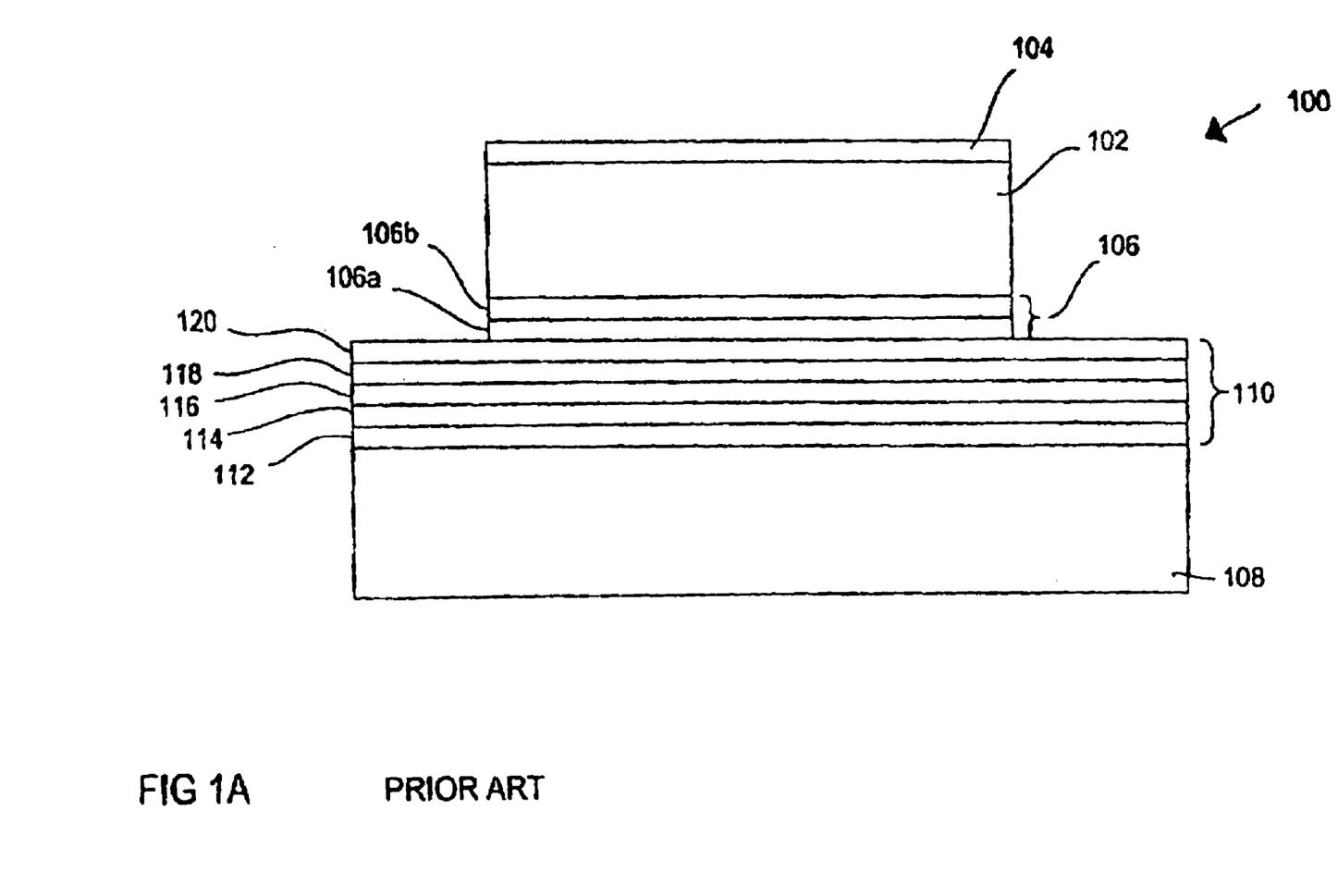
FIG. 1A is a schematic illustration of a BAW resonator with a resonance frequency of about 1.8 GHz with a conventional acoustic reflector.

FIG. 1A shows a schematic illustration of a conventional BAW resonator having a resonance frequency of about 1840 MHz in the embodiment shown. The BAW resonator 100 includes a piezoelectric layer 102, such as from aluminum nitride (AlN). Furthermore, the BAW resonator 100 includes a top electrode 104 that may itself be constructed from several metallic and dielectric layers. The bottom electrode 106 of the BAW resonator 100 may also be constructed from several metallic and dielectric layers.

In the example shown, the bottom electrode 106 includes a first layer 106a from a material with low impedance, e.g. aluminum (Al), and a second layer 106b from a material with high acoustic impedance, e.g. tungsten (W).

In the example illustrated, the piezoelectric layer 102 has a thickness of 1200 nm. As mentioned, the top electrode 104 may include a plurality of layers, an Al layer of the top electrode 104 having a thickness of about 200 nm, and a W layer of the top electrode 104 having a thickness of about 150 nm. The W layer 106a of the bottom electrode 106 has a thickness of about 150 nm, and the Al layer 106b of the bottom electrodes 106 has a thickness of about 200 nm.

The BAW resonator according to FIG. 1A further includes a substrate 108, such as a silicon substrate. On a surface of the substrate, facing the resonator element 100, an acoustic mirror or acoustic reflector 110 is formed, which is disposed between the substrate 108 and the bottom electrode 106. The acoustic mirror 110 includes a plurality of layers 112, 114, 116, 118, 120 made from a material with high acoustic impedance and a material with low acoustic impedance, with layers from a material with high acoustic impedance and layers from a material with low acoustic impedance being alternately disposed. The mirror 110 is designed for the above-mentioned resonance frequency of about 1840 MHz of the resonator. Here, a λ/4 mirror is involved, as it is conventionally used.

The first layer 112 consists of a material with low acoustic impedance, e.g. $SiO_2$, the second layer 114 consists of a material with high acoustic impedance, e.g. W, the third layer 116 consists of a material with low acoustic impedance, e.g. $SiO_2$, the fourth layer 118 consists of a material with high acoustic impedance, e.g. W, and the fifth layer 120 consists of a material with low acoustic impedance, e.g. $SiO_2$. In the example illustrated, the layers 112, 116, and 120 are $SiO_2$ layers of equal thickness, e.g. 810 nm at the considered resonance frequency, and the layers 114 and 118 are W layers of equal thickness, e.g. 710 nm at the considered resonance frequency.

The typical Q-factor, as it can be obtained for a BAW resonator on an acoustic mirror, as it is exemplarily shown in FIG. 1A, ranges from about 400 to 700. Although these values are sufficient to keep pace with SAW devices (SAW=surface acoustic wave) for applications in the mobile phone area, these values are barely sufficient enough to produce, for example, antenna duplexers or other demanding low-loss/high-selectivity filters, e.g. US-CDMA filters or W-CDMA filters. Duplexers available on the market today are large ceramic components because the SAW filters do not have sufficient power handling capability. CDMA filters are often made by so-called "split-band" SAW filters using two filters connected in parallel with different center frequencies, because a single SAW filter would not have sufficiently steep transition characteristics.

It should be mentioned here that an improvement of the quality for BAW resonators to values greater than 700 is not only of great interest for CDMA filters. In general, an improvement in the quality of the resonators leads to a performance improvement of the filters (e.g. filter band width increase and/or improvement of the standing wave ratio) and thus to a better yield in the mass production of these devices.

For the above-mentioned loss mechanisms, no widely accepted theory exists with respect to that mechanism that is dominant in BAW resonators. Viscous losses (material damping) and electrical losses by the ohmic resistance of the electrodes and the wiring have so far been regarded as main suspects. Electrical losses have been well characterized and it can be shown that these are not the dominating losses. Viscous losses are unlikely to represent a limiting factor, because secondary acoustic modes in the resonators very often have very high Q-factors that would not be present if the materials themselves would cause a strong damping of the acoustic waves. Thus, experimental results of overmode resonators with qualities of 68000 have been shown, for example, by K. M. Lakin et al., IEEE Trans. Microwave Theory, Vol. 41, No. 12, 1993.

Interferometric measurements have shown that part of the energy is also lost by lateral acoustic waves, which means that the energy trapping does not work perfectly. In order to avoid this loss mechanism, an experimental resonator with an "air" trench (unfilled trench) surrounding the active area has been constructed so that no waves could escape in the lateral direction. This experimental arrangement led to the surprising result that the Q-factor changed only marginally as opposed to conventional resonator elements, which is an indication that the energy loss by lateral acoustic waves is also not dominating.

It has already been possible to experimentally show that a rough substrate backside (wafer backside) has a significant influence on the secondary modes in BAW resonators having acoustic mirrors. This is to be seen as indication that vertical waves are to be considered as possible sources of losses, In order to verify this, samples having polished backsides have been prepared. It has been found that strong reflections of the waves from the backside occurred after polishing, which were not present in the samples with the rough backside. This means that, in the sample with the polished backsides, the acoustic wave energy that has before been scattered and consequently lost at the rough backside surface is now reflected back and fed back into the piezoelectric layer. Furthermore, using laser interferometry, the inventors could prove that vibrations are present at the backside. Since the acoustic mirrors for the longitudinal waves in the resonator element at its operation frequency are optimized, it is a strong indication that the waves observed at the backside are shear waves.

At this point, it should be noted that all relevant publications on acoustic mirrors for BAW resonators only describe the reflectivity of the mirror for longitudinal waves, i.e. waves propagating in the direction of the elastic deflection, because this is the only obvious wave type generated by conventional strongly oriented piezoelectric thin film layers. Furthermore, this wave type is that defining the main resonance of a BAW element by a standing wave condition in the stack. Acoustic mirrors are Bragg reflectors having various layers with high and low acoustic impedance. Conventionally, layer thicknesses are used, which lie as close as possible to a dimension in the area of λ/4 (λ=wavelength) of the longitudinal waves, because here an optimum reflectivity at the main resonance frequency is achieved.

Shear waves are not excited in ideal, infinitely large resonators, because there is no piezoelectrical coupling between a vertical electrical field and the shear stresses in a piezo layer with a dominant C-axis crystal orientation. In the prior art, no publication is known, which explains or describes the effect of shear waves in thin layer BAW resonators. There are three reasons why shear waves are yet generated in real resonators:

(a) In the piezoelectric layer of the BAW resonator, tilted grain boundaries may occur. If this tilt has even a small portion of a preferred direction, then a vertical field may lead to launch of shear waves in the piezoelectric layer.

Figure 1B:
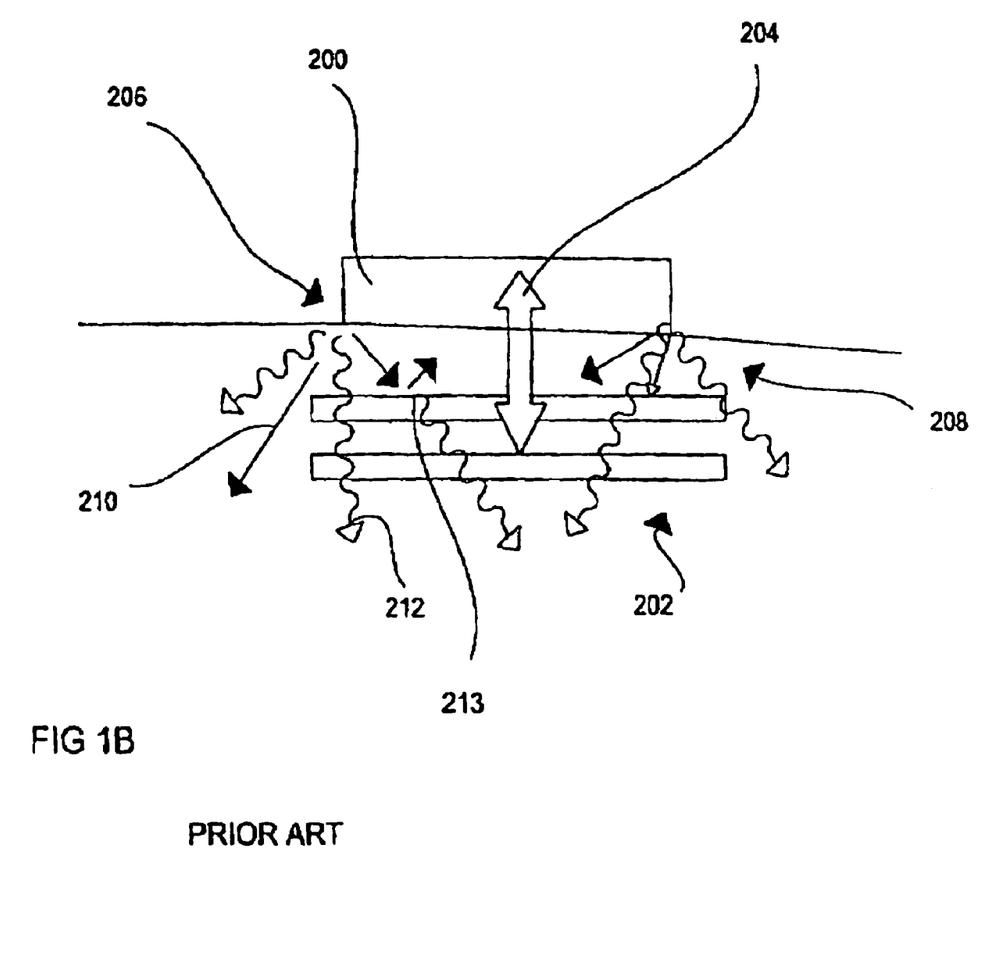
FIG. 1B is a schematic illustration for the formation of acoustic scattering waves at the lateral boundary wall of a BAW resonator.

(b) At the edges of a resonator, certain acoustic edge conditions for boundary area between the active area and the outside area must be fulfilled. If these boundary conditions between the outside area and the active area are not well adapted to each other, a generation of shear waves at the circumference of the resonator may occur. In physical terms, the lateral boundary wall of the resonator leads to the generation of acoustic scattering waves propagating in all spatial directions (of course only within the solid) and with all possible polarizations, which is illustrated schematically in FIG. 1B. In FIG. 1B, the resonator is schematically shown at 200, which includes the electrodes 104 and 106 shown in FIG. 1A as well as the piezoelectric layer 102. The mirror is schematically shown at 202. The arrow 204 illustrates the longitudinal excitation in the entire active area of the device. The arrows 206 and 208 show scattering waves occurring at the edge of the resonator 200, the scattering waves including both longitudinal portions 210 (straight arrows) and shear wave portions 212 (wavy arrows).

(c) The longitudinal waves 210 moving in a direction not exactly perpendicular to the substrate plans (see FIG. 1B) are at least partly converted to shear waves 212 at the interfaces 213 of the different layers. The shear waves 212 may then easily pass the acoustic mirror 202, because it is only optimized for a reflection of the longitudinal waves.

Since most film materials for acoustic resonators have Poisson ratios ranging from about 0.17 to 0.35, the velocity of the shear waves is usually at about half of the velocity of the longitudinal waves. For this reason, with λ/4 mirrors designed for the reflection of longitudinal waves, it may easily occur that the shear waves are not reflected well enough. In fact, the acoustic layer thickness of the layers of the mirror lies at about λ/2 for shear waves, which exactly corresponds to the anti-reflection condition for this type of wave (i.e. a transmission as high as possible).

Figure 1C:
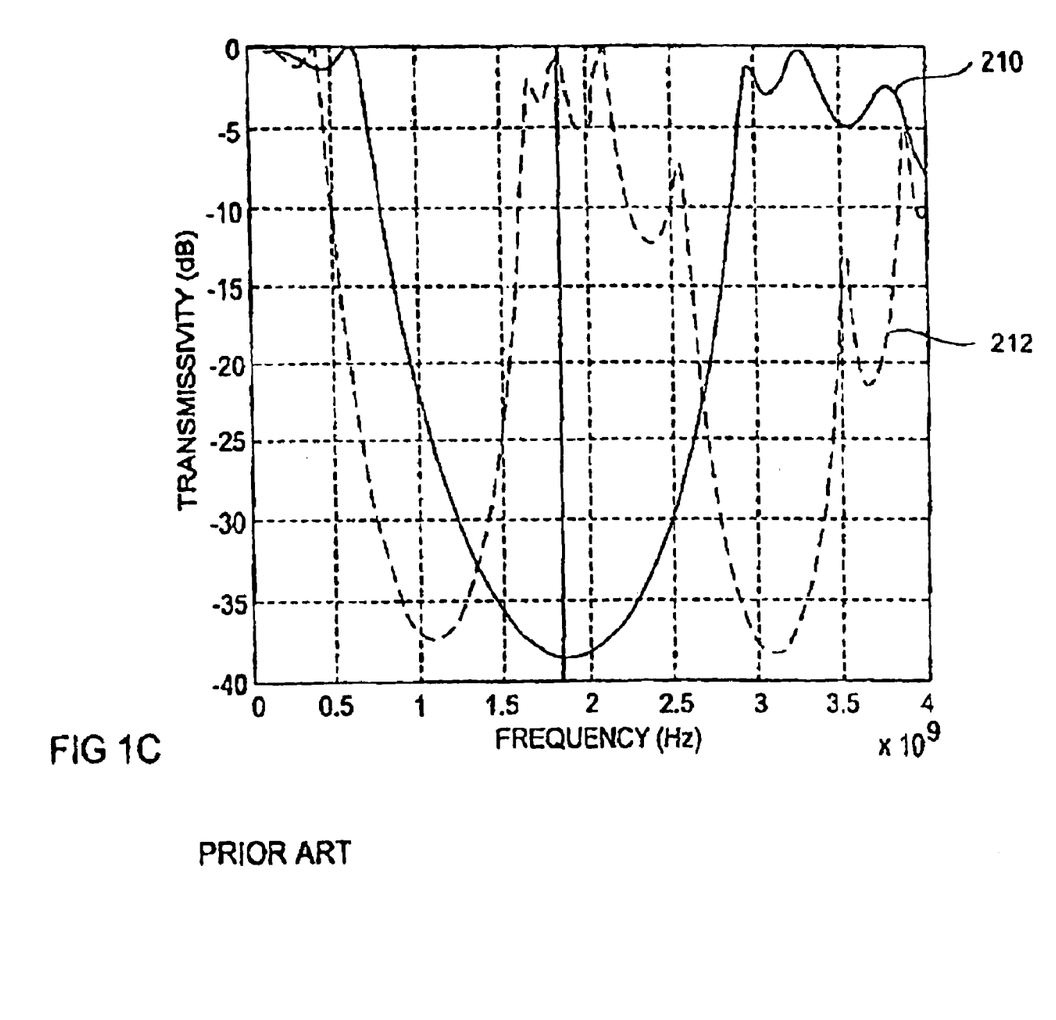
FIG. 1C shows the curve of the transmittance of the conventional acoustic reflector from FIG. 1A between 0.1 GHz and 4 GHz for a longitudinal wave existing in the BAW resonator and shear wave existing in the BAW resonator.

This situation is explained in greater detail in FIG. 1C for the example shown in FIG. 1A of a BAW resonator with the dimensions indicated there. Across a frequency area from 1 GHz to 4 GHz, the transmittance of the acoustic mirror 110 there illustrated for longitudinal waves 210 existing in the BAW resonator and shear waves 212. At this point, it should be understood that all layers below the piezoelectric layer 102, i.e. in the example shown in FIG. 1A, the layers 106a, 106b, 112, 114, 116, 118, and 120, are to be taken into account in their effect as acoustic reflector, i.e. in particular also the layers 106a and 106b of the bottom electrode 106. The reason for this is that the electrodes also have a reflecting effect on the acoustic waves generated in the piezoelectric layer. The property of "reflectivity" can only be associated with the entirety of all layers lying beneath the piezoelectric layer 102 in a meaningful manner, so that by the term "acoustic reflector" or "acoustic mirror", in considering the reflection property thereof, the entirety of the layers is to be understood, which are disposed between the piezoelectric layer 102 and the substrate 108.

In order to calculate the reflectivity of an acoustic mirror with n layers (in FIG. 1A n=5 Bragg layers+2 electrode layers=7), the transformation equation of a terminating resistor through a long line (see equation (1) below) may be used, which is obtained from the so-called Mason model (see W. P. Mason, Physical Acoustics I, Part A, Academic Press, NY, 1994), to obtain an overall impedance $Z_i$ (see K. M. Lakin et al, IEEE Trans. Microwave Theory, Vol. 41, No. 12, 1993). The following applies:

$$Z_i = z_i \left[ \frac{Z_{i-1} \cdot \cos\Theta_i + i \cdot z_i \cdot \sin\Theta_i}{z_i \cdot \cos\Theta_i + i \cdot Z_{i-1} \cdot \sin\Theta_i} \right] \quad (1)$$

with:

i=1. . . n, wherein "1" numbers the layer adjacent to the substrate, and "n" the layer adjacent to the piezo layer, $z_i$=the acoustic impedance of the considered layer i, $Z_{i-1}$=the entire acoustic impedance of the so-far considered layers 1 to i−1, and $\Theta_i$=the entire phase across the layer i.

$\Theta_i$ is determined according to the following calculation rule:

$$\Theta_i = \frac{\omega \cdot d_i}{v_i} \quad (2)$$

with:

$v_i$=the velocity of the acoustic wave in the layer i, depending on the polarization state.

$d_i$=the thickness of the layer i and, $\omega$=angular frequency.

For a given stack, see e.g. FIG. 1A, it is being started with the calculation of the entire input impedance to the first layer 112 adjacent to the substrate 108 using the above equations, wherein for the first calculation $Z_{i-1}=Z_{sub}$=substrate impedance and $z_i=z_1$=acoustic impedance of layer 1 (layer 112 in FIG. 1A) applies. For the next layer, layer 2 (layer 114 in FIG. 1A), the above equations are also used, wherein then $Z_{i-1}=Z_1$=calculated entire impedance up to the layer 1, and the other parameters as for layer 2 apply. This calculation is repeated for all layers up to the piezoelectric layer.

The mirror reflection coefficient is then calculated according to the following calculation rule:

$$R = \frac{Z_n - z_p}{Z_n + z_p} \quad (3)$$

with:

$Z_n$=calculated impedance of all mirror and electrode layers, and $Z_p$=the acoustic impedance of the piezoelectric layer.

In general, the reflection coefficient is a complex value whose magnitude describes the amplitude of the reflected wave (related to the amplitude of the incident wave), and whose phase mirrors the effective phase jump of the reflected wave.

The above calculation may be calculated both for longitudinal waves and shear waves using the values exemplarily indicated in the following table for different materials for acoustic impedances and wave velocities for the different waves.

| Material | $v_l$ for a longitudinal wave | $z_l$ for a longitudinal wave ($10^6$ kg/m²s) | $V_s$ for a shear wave | $z_s$ for a shear wave ($10^6$ kg/m²s) |
|---|---|---|---|---|
| Al | 6422 m/s | 17.3 | 3110 m/s | 8.4 |
| W | 5230 m/s | 101 | 2860 m/s | 55.2 |
| AlN | 10400 m/s | 34 | 6036 m/s | 19.7 |
| SiO$_2$ | 5970 m/s | 13.1 | 3760 m/s | 8.3 |
| Si | 8847 m/s | 19.3 | 5300 m/s | 11.6 |
| SiN | 11150 m/s | 36.2 | 6160 | 20 |

Based on the above values, the reflectivity of the mirror may be calculated both for longitudinal waves and shear waves. If the result is to be expressed as transmissivity in dB, it is calculated as follows:

$$T_{dB}=10 \cdot \log(1-|R|^2).$$

As can be seen from FIG. 1C, the curve of the transmittance of the mirror is very low for longitudinal waves 210 in the area of the operation frequency of about 1.8 GHz (at about −38 dB), i.e. longitudinal waves are very strongly reflected in the frequency range of about 1.0 to 2.7 GHz, i.e. the mirror has high reflectivity. Considering the transmittance of the mirror for the shear waves 212, shown in comparison therewith, it can easily be recognized that here the transmissivity in the area of the operation frequency (1.8 GHz) is very high (about −2 dB) for the shear waves, i.e. a large portion of the energy transported by the shear waves is not reflected, but leaks from the BAW resonator and is lost.

SUMMARY OF THE INVENTION

Starting from this prior art, it is the object of the present invention to provide a BAW resonator with an acoustic reflector whose performance at the resonance frequency is improved.

The present invention provides a BAW resonator with a piezoelectric layer with a first surface and a second surface opposing the first surface, a first electrode disposed on the first surface of the piezoelectric layer, a second electrode disposed on the second surface of the piezoelectric layer, a substrate, and an acoustic reflector disposed between the substrate and the second electrode, the acoustic reflector comprising a plurality of layers from a material with high acoustic impedance and from a material with low acoustic impedance, wherein areas with layers with high acoustic impedance and areas with layers with low acoustic impedance are alternately adjacently disposed, wherein the performance of the acoustic reflector is determined by its reflectivity for a longitudinal wave existing in the BAW resonator at the resonance frequency of the BAW resonator and by its reflectivity for a shear wave existing in the BAW resonator at the resonance frequency of the BAW resonator, and wherein the layers of the acoustic reflector and layers disposed between the acoustic reflector and the piezoelectric layer are selected, with reference to their number, material, and thickness, such that the transmissivity for the longitudinal wave and the transmissivity for the shear wave in the area of the resonance frequency is smaller than −10 dB.

According to a further aspect, the present invention provides for a filter having a plurality of such BAW resonators.

Preferably, the transmissivity for the longitudinal wave and the transmissivity for the shear wave in the area of the resonance frequency is smaller than −15 dB. According to a further preferred embodiment, the transmissivity for the longitudinal wave in the area of the resonance frequency is smaller than −20 dB, and the transmissivity for the shear wave in the area of the resonance frequency is smaller than −15 dB.

Preferably, the layers with low acoustic impedance are made from SiO$_2$ or Al, and the layers with high acoustic impedance are made from tungsten.

According to a further aspect, the present invention provides a BAW resonator in which the layers of the acoustic resonator are selected, so that the BAW resonator has an unambiguous and desired dispersion performance. Preferably, the layers are selected, so that the distance between the longitudinal main resonance and the first shear harmonic wave is greater than a bandwidth of the resonator, preferably greater than the bandwidth of the longitudinal main resonance of the resonator.

According to a further aspect, the present invention provides a filter circuit with a plurality of BAW resonators using the inventive acoustic reflectors, wherein the resonator elements and the acoustic reflectors of the BAW resonators are preferably formed on a common substrate.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

In the following description of the preferred embodiments, similar elements in the individual drawings are provided with similar or the same reference numerals.

The present invention provides acoustic mirrors or acoustic reflectors for BAW resonators, which lead to significant improvement of the Q-factor. BAW resonators having the inventive acoustic reflectors are necessary in particular for applications requiring Q-factors larger than 700, such as the above-mentioned employment in antenna duplexers and other filter applications requiring low losses and high selectivity, for example the mentioned US-CDMA filters or W-CDMA filters.

According to the invention, an improved acoustic reflector/acoustic mirror is provided, which avoids the leakage of acoustic energy (acoustic leakage) in the vertical direction, i.e. in the direction in which the individual layers of the element are disposed on top of each other.

According to a first preferred embodiment of the present invention, the reflectivity of the acoustic mirror is inventively optimized both for the longitudinal wave and the shear wave.

Figure 2A:
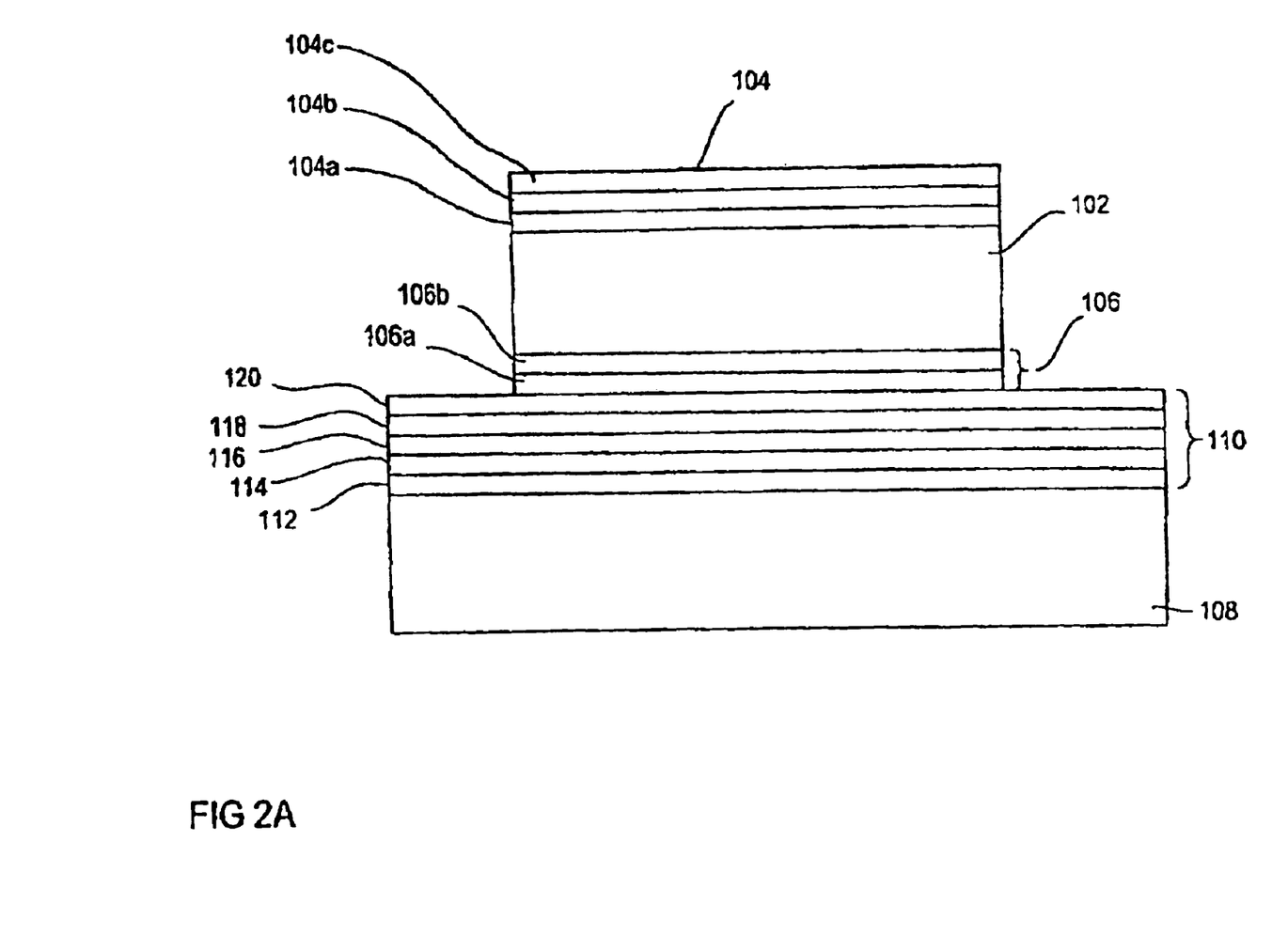
FIG. 2A is a schematic illustration of a BAW resonator with a resonance frequency of about 1.8 GHz and an acoustic reflector according to first and second embodiments of the present invention.

In FIG. 2A, a first embodiment of a BAW resonator is shown, which has an acoustic mirror according to the present invention. In terms of the construction, the element shown in FIG. 2A is similar to the element shown in FIG. 1A with respect to the sequence of the layers, but here, according to the invention, other layer thicknesses for the individual layers of the acoustic mirror were selected. Like the one in FIG. 1, the BAW resonator in FIG. 2A has a resonance frequency of about 1840 MHz. In the example shown, the bottom electrode 106 also includes a first layer 106a from a material with low impedance, namely aluminum (Al), and a second layer 106b from a material with high acoustic impedance, namely tungsten (W). The piezoelectric layer 102 has a thickness of 1200 nm. The top electrode 104 may include a plurality of layers, wherein here an Al layer of the top electrode 104 has a thickness of about 200 nm, and a W layer of the top electrode 104 has a thickness of about 150 nm. The W layer 106a of the bottom electrode 106 has a thickness of about 150 nm, and the Al layer 106b of the bottom electrodes 106 has a thickness of about 200 nm.

The first layer 112 of the acoustic reflector 110 is a layer with low acoustic impedance, e.g. $SiO_2$ with a thickness of about 600 nm. The second layer 114 is a layer from a material with high acoustic impedance, namely tungsten, and a thickness of about 500 nm. The third layer 116 is a layer with low acoustic impedance, namely $SiO_2$, which has a thickness of about 600 nm. The fourth layer 118 is a layer from a material with high acoustic impedance, namely tungsten, which has a layer thickness of about 500 nm. The fifth layer 120 is a layer from a material with low acoustic impedance, namely $SiO_2$, which has a layer thickness of about 850 nm.

Figure 2B:
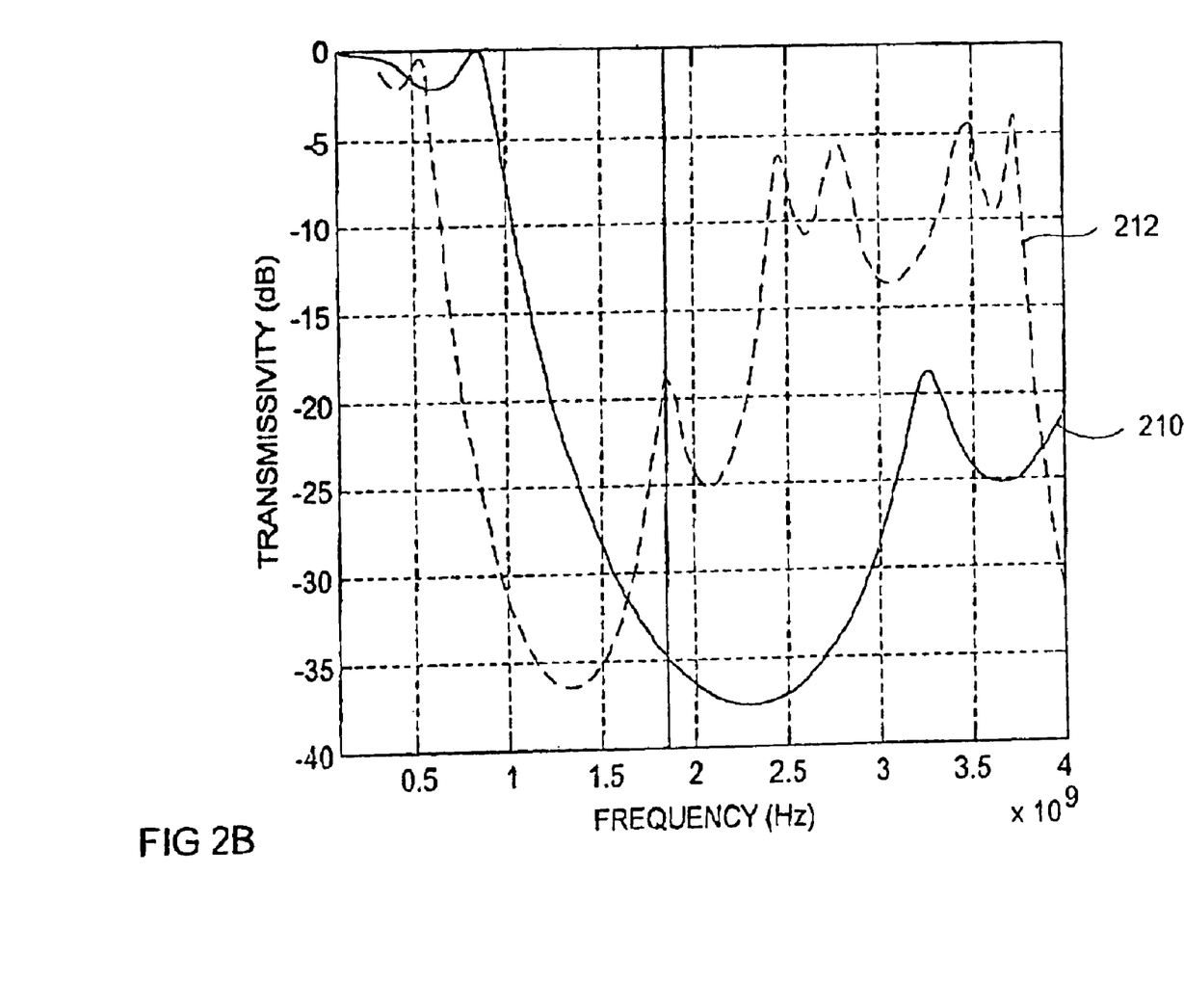
FIG. 2B shows the curve of the transmittance of the acoustic reflector according to the first embodiment between 0.1 GHz and 4 GHz for a longitudinal wave existing in the BAW resonator and for a shear wave existing in the BAW resonator.

The embodiment described on the basis of FIG. 2A includes an acoustic reflector representing a trade-off regarding the reflectivity of the mirror for a longitudinal wave as well as for a shear wave. In FIG. 2B, the mirror transmittance is shown across the frequency range of 0.1 GHz to 4 GHz for the longitudinal wave 210 and for the shear wave 212. In the area of the operation frequency of 1.8 GHz the transmittance of the mirror is at about −18 dB for the shear wave 212, and the transmittance of the mirror is at about −35 dB for the longitudinal wave, so that both the shear wave and the longitudinal wave experience very high reflection by the acoustic mirror at the operation frequency.

In comparison with FIG. 1B, it can easily be seen that by a slight increase of the transmittance by about 3 dB for the longitudinal wave a very strong decrease of the transmittance of the mirror for the shear wave was achieved, so that in the area of the resonance frequency 1.8 GHz it is ensured by the inventive acoustic reflector that also the energy transported by the shear wave is reflected back and does not leak from the mirror and is lost. Hereby, a significant improvement of the Q-factor may be achieved, so that it lies above 700, so that such BAW resonators may also easily be used in applications requiring such high Q-factors, such as the above-mentioned duplexers or filter arrangements with low losses and high selectivity.

Up to now, for optimizing the resonator performance, it has been proposed to optimize the mirror quality for longitudinal waves and shear waves. There is, however, still a further property of the layer stack of the BAW resonator that is very strongly influenced by the layer thicknesses of mirror layers, and that in turn has a strong influence on the resonator performance, namely the so-called "dispersion type". The "dispersion type" is discussed in detail in WO 01/06647 A.

The exact calculation of the dispersion type usually requires a two-dimensional acoustic theory of multi-layer systems (see e.g. M. J. S. Lowe, IEEE Trans. UFFC, Vol. 42, No. 4, 1995), but with the above-mentioned one-dimensional Mason model a good overview of the dispersion performance may also be attained. For this, in a first step, the electric impedance performance of the layer stack is calculated in a manner known to a person skilled in the art (i.e. using the longitudinal acoustic material properties). In a second step, the calculation is repeated, but now the shear wave material parameters are used (see the table indicated above). The characteristic impedance curve calculated therein has no electric relevance, because such a standing sheer wave cannot be excited by a vertical electrical field in a c-axis oriented piezo layer. But the resonances in the characteristic curve do show the frequencies at which mechanical resonances with standing shear waves may occur. The dispersion type then results from the distance between the longitudinal main resonance and the first shear harmonic wave. If the first shear harmonic wave is below the longitudinal main resonance, this is called type I dispersion in terms of WO 01/06647 A, in the reverse case type II dispersion.

Both types of dispersion allow optimizing the resonator performance with reference to the spurious modes, both kinds, however, requiring a significantly different form of edge design (see WO 01/06647 A). Thus, it is easily understandable that in the case in which now the first shear harmonic wave and the longitudinal main resonance lie very closely together (i.e. the distance is smaller than the bandwidth of the longitudinal resonance), the one dispersion type transitions into the other, and thus the dispersion type is not unambiguously determined. This case is disadvantageous, because then it is not clear which kind of edge design is to be used for the suppression of spurious modes.

Figure 2C:
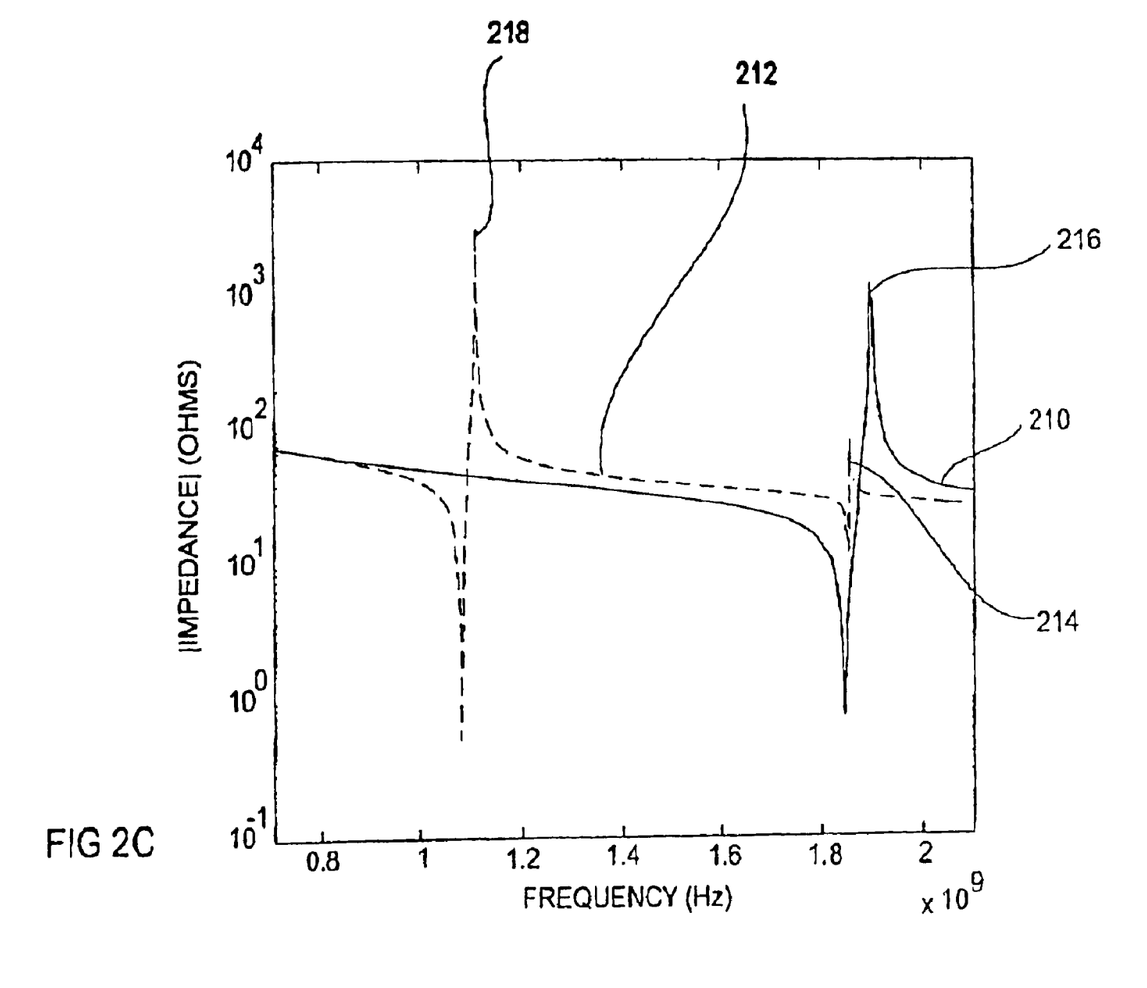
FIG. 2C shows the impedance curve according to the Mason model for a BAW resonator with an acoustic reflector according to the first embodiment between 0.7 GHz and 2.1 GHz using longitudinal material parameters and shear wave material parameters.

In FIG. 2C, the result of the above-mentioned calculation with the Mason model for the first inventive embodiment (FIG. 2A) is illustrated. FIG. 2C shows the impedance curve according to the Mason model for a BAW resonator with an acoustic reflector according to the first embodiment (see FIG. 2A) between 0.7 GHz and 2.1 GHz. The reference numeral 210 designates, by analogy with FIG. 2B, the impedance curve for longitudinal material parameters, and the reference numeral 212 designates, by analogy with FIG. 2B, the impedance curve for shear wave material parameters. In FIG. 2C, the reference numeral 214 designates the first shear harmonic wave, the reference numeral 216 designates the longitudinal main resonance, and the reference numeral 218 designates the shear main resonance. It can be seen that in this case exactly the above-described disadvantageous case occurs. For the avoidance of this situation, in optimizing the mirror performance according to this patent specification, the edge condition should be met that the frequency distance of first shear harmonic wave and longitudinal main resonance is greater than the bandwidth of the longitudinal main resonance. This clearly restricts the amount of the suitable mirror layer sequences and impedes the optimizing, but modern optimizing programs are unproblematically able to take such secondary conditions into account.

Figure 2D:
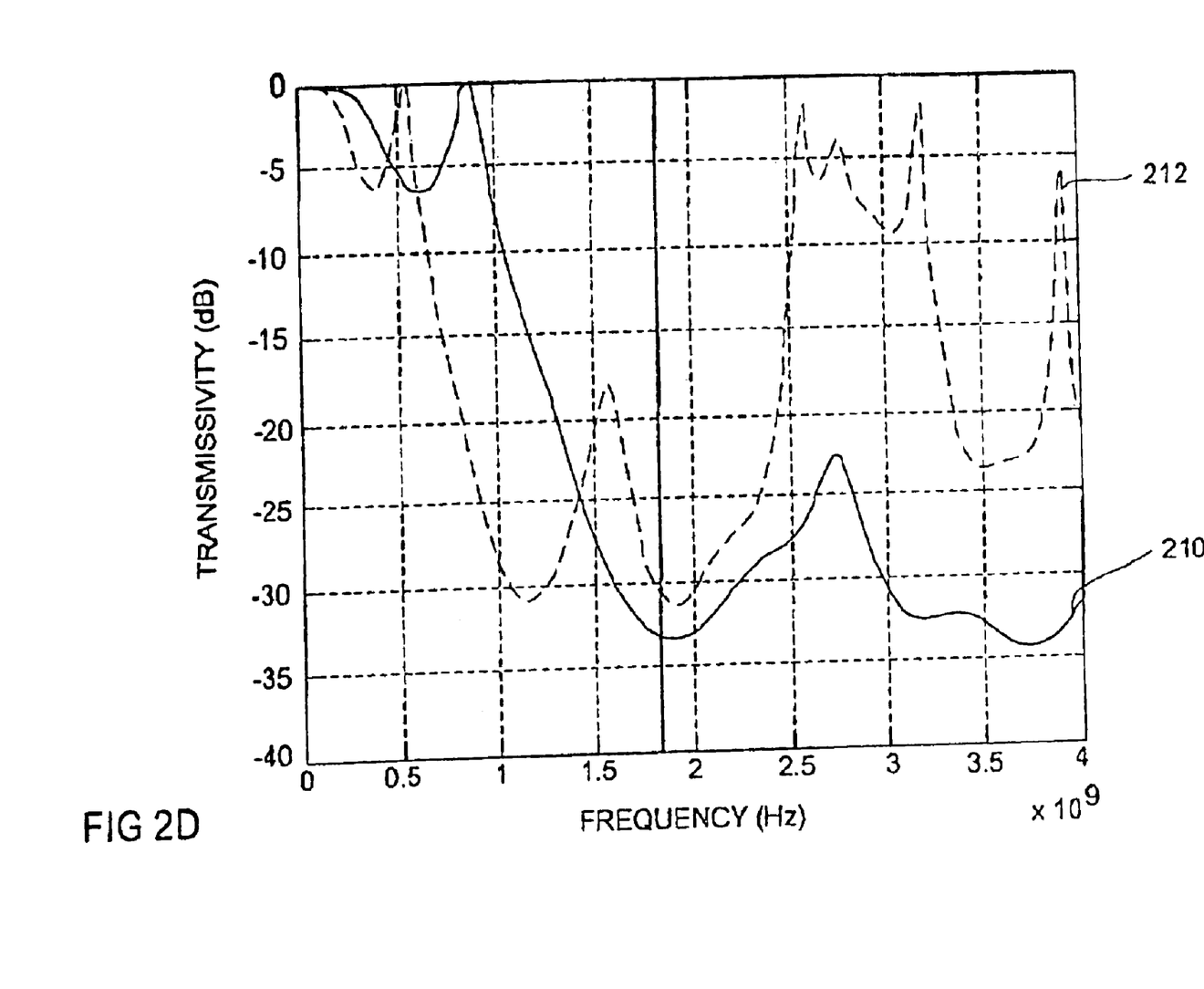
FIG. 2D shows the curve of the transmittance of the acoustic reflector according to the second embodiment between 0.1 GHz and 4 GHz for a longitudinal wave existing in the BAW resonator and for a shear wave existing in the BAW resonator.
Figure 2E:
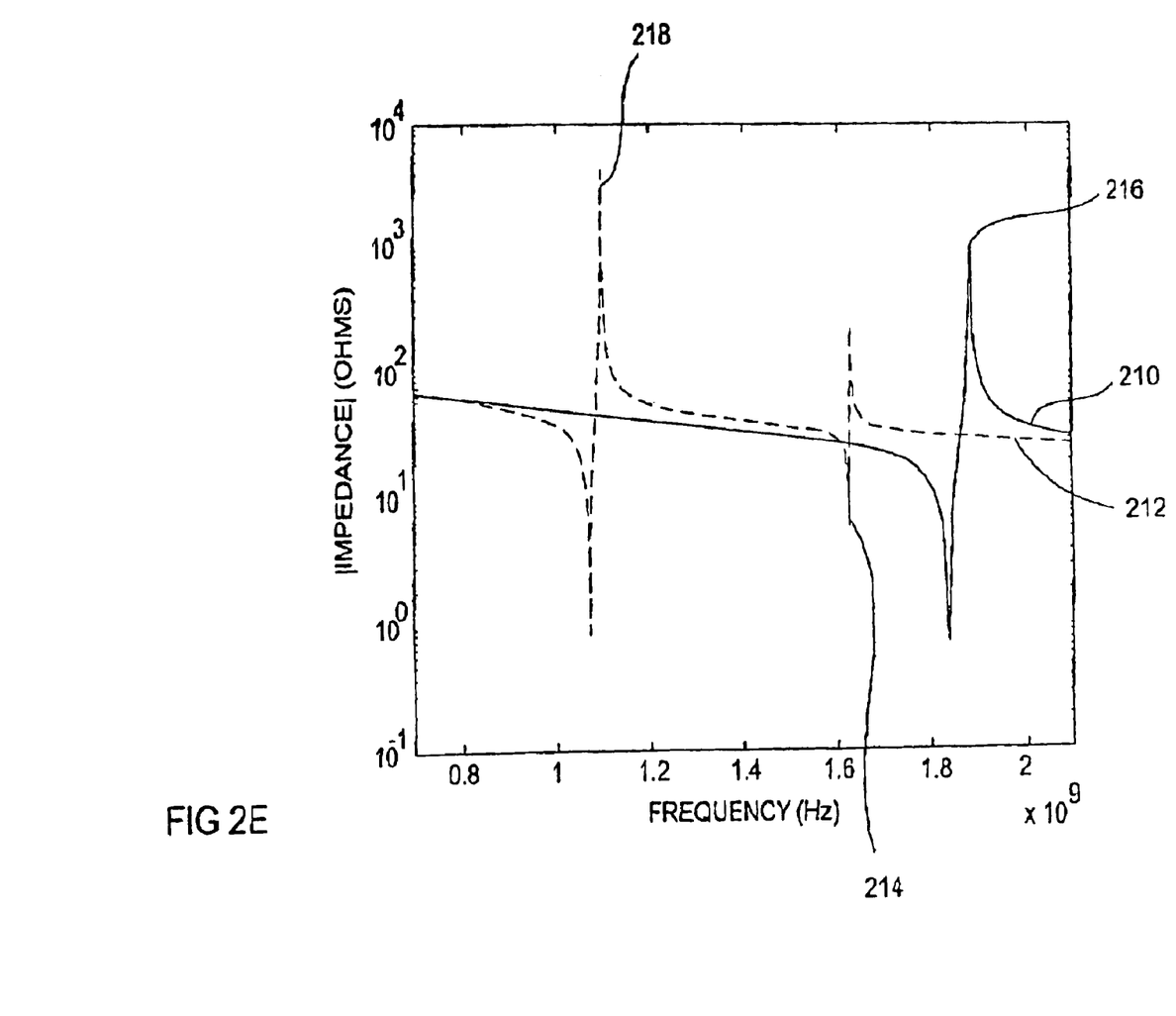
FIG. 2E shows the impedance curve according to the Mason model for a BAW resonator with an acoustic reflector according to the second embodiment between 0.7 GHz and 2.1 GHz using longitudinal material parameters (210) and shear wave material parameters (212)

An example for such an optimizing with secondary condition is illustrated in FIGS. 2D and 2E. The layer sequence is again identical with the first embodiment, but the thicknesses of individual layers are selected as follows: the lowest layer 112 is $SiO_2$ with 2600 nm, the layers 114 (tungsten), 116 ($SiO_2$), and 118 (tungsten) are each 500 nm thick, the layer 120 ($SiO_2$) is 1000 nm thick. The rest of the layer stack is identical with the previously mentioned embodiments, with the exception of the tungsten layer above the piezo layer: here, the thickness was reduced to 130 nm for frequency correction (since this layer is above the piezo layer, it does not have any influence on the performance of the acoustic reflector, but on the dispersion performance). It should be appreciated that, according to the invention, both the mirror performance with reference to longitudinal waves as well as shear waves is very good (FIG. 2D) and the dispersion performance is now unambiguously type I (FIG. 2E).

Subsequently, a further embodiment is to be described. Differing from the above-mentioned layer stacks, this one has yet an additional passivation layer from silicon nitride (short SiN) as the topmost layer (on the top layer of the top electrode of the resonator). Due to the frequency scalability of the optimization shown here, the layer thicknesses of this layer stack are no longer indicated in absolute thicknesses, but in the thickness relative to the longitudinal wavelength $\lambda_{long}$ in the respective layer, so that the values given in the following table result:

| Layer no. | Material | Layer thickness rel. to $\lambda_{long}$ |
|---|---|---|
| 112 | SiO2 | 0.770 |
| 114 | Tungsten | 0.175 |
| 116 | SiO2 | 0.250 |
| 118 | Tungsten | 0.245 |
| 120 | SiO2 | 0.180 |
| 106a | Aluminum | 0.130 |
| 106b | Tungsten | 0.070 |
| 102 | AlN | 0.220 |
| 104a | Tungsten | 0.028 |
| 104b | Aluminum | 0.080 to 0.12 |
| 104c | SiN | 0.008 |

The deviations from these thicknesses must be smaller than 20%.

With respect to the above-described preferred embodiments, it is to be understood that the present invention is of course not limited hereto. With respect to the preferred embodiments, it is to be understood that the present invention is not limited to BAW resonators including resonator elements having aluminum nitride (AlN) as piezoelectric layer. Instead, e.g. PZT or ZnO may be used as piezoelectric materials. With respect to the electrode materials described above, it is to be understood that the present invention is not limited to the combination of tungsten and aluminum, but instead single-layer electrodes or other combinations of materials with high acoustic impedance and materials with low acoustic impedance may also be used. Furthermore, it is to be understood that between the layers there may also be thin intermediate layers, as they are conventional in semiconductor technology for priming, as seed layers, or as etch stop. These have not been mentioned here, because they are typically so thin they do not have to be taken into account acoustically.

Instead of the above-described silicon substrates and the structures additionally applied thereto, it is to be understood that the present invention is not limited to these silicon substrates, but that also other suitable substrates may be used by a person skilled in the art.

With respect to the materials used for the acoustic reflectors according to preferred embodiments, it is to be understood that the present invention is not limited to the use of $SiO_2$ as material with low acoustic impedance, that also other suitable materials with low acoustic impedance may be used. Instead of tungsten used as material with high acoustic impedance, also other materials with high acoustic impedance may be used, such as molybdenum, platinum, and titanium nitride. Instead of acoustic mirrors with two layers with high acoustic impedance, more than two may also be used. The first layer above the substrate does not at all have to be a layer with low acoustic impedance, as it has been assumed for the embodiments.

Figure 3:
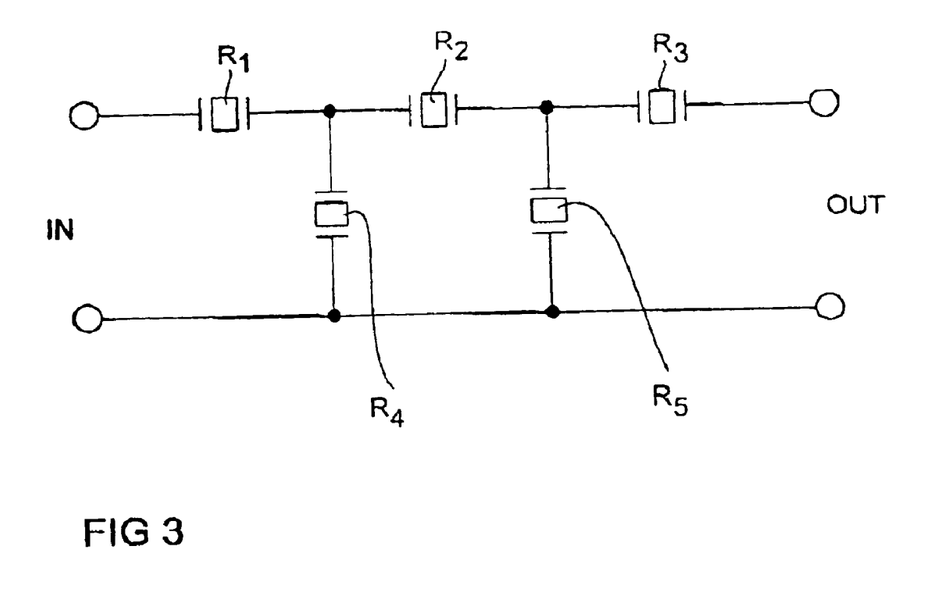
FIG. 3 is a schematic illustration of a filter with a plurality of inventive BAW resonators.

According to a further aspect, the present invention provides a filter arrangement, as it is described for example on the basis of FIG. 3. The filter arrangement includes a plurality of BAW resonators $R_1$, $R_2$, and $R_3$, which are disposed in a serial branch of the filter between an input port IN and an output port OUT. The resonators $R_1$ to $R_3$ provide so-called series resonances of the filter. Furthermore, in the illustrated example of the filter arrangement, the resonators $R_4$ and $R_5$ are provided, which are disposed in the parallel branches of the filter and provide the parallel resonance of the filter.

Furthermore, it is to be understood that the method described here may also be used for the optimizing of the acoustic reflector of so-called "stacked crystal filters".

Thus, according to the invention, an improved performance (Q-factors greater than 700) of BAW resonators is achieved, in which the plurality of layers of the acoustic reflector and the layers disposed between the acoustic reflector and the piezoelectric layer are selected, with reference to their number, material and thickness, such that the transmissivity for the longitudinal wave for the shear wave in the area of the resonance frequency is smaller than −10 dB. This is achieved, for example, by the above-described mirrors. Regarding the above teachings, it is clear, however, for persons skilled in the art that this is also achievable by other mirror configurations.

Although specific embodiments of the invention have been illustrated and described herein, it will be appreciated by those skilled in the art that various additional modifications can be made in the embodiments. This application is intended to cover any adaptations or variations of the invention. It is intended that the scope of this invention be limited only by the appended claims.

What is claimed is:

1. A BAW resonator with
   a piezoelectric layer with a first surface and a second surface opposing the first surface;
   a first electrode disposed on the first surface of the piezoelectric layer;
   a second electrode disposed on the second surface of the piezoelectric layer;
   a substrate; and
   an acoustic reflector disposed between the substrate and the second electrode, the acoustic reflector comprising a plurality of layers from a material with high acoustic impedance and from a material with low acoustic impedance, wherein areas with layers with high acoustic impedance and areas with layers with low acoustic impedance are alternately adjacently disposed,
   wherein the performance of the acoustic reflector is determined by its reflectivity for a longitudinal wave existing in the BAW resonator at the resonance frequency of the BAW resonator and by its reflectivity for a shear wave existing in the BAW resonator at the resonance frequency of the BAW resonator, and
   wherein the layers of the acoustic reflector and layers disposed between the acoustic reflector and the piezoelectric layer are selected, with reference to their number, material, and thickness, such that the transmissivity for the longitudinal wave and the transmissivity for the shear wave in the area of the resonance frequency is smaller than −10 dB.

2. The BAW resonator of claim 1, wherein the transmissivity for the longitudinal wave and for the shear wave in the area of the resonance frequency is smaller than −15 dB.

3. The BAW resonator of claim 1, wherein the transmissivity for the longitudinal wave in the area of the resonance frequency is smaller than −20 dB, and wherein the transmissivity for the shear wave in the area of the resonance frequencies are smaller than −15 dB.

4. The BAW resonator of claim 1, wherein the layers of the acoustic resonator are selected such that the BAW resonator has an unambiguous and desired dispersion performance.

5. The BAW resonator of claim 4, wherein the layers of the acoustic resonator are selected such that the distance between the longitudinal main resonance and the first shear harmonic wave is greater than the bandwidth of the resonator.

6. The BAW resonator of claim 5, wherein the layers of the acoustic resonator are selected such that the distance between the longitudinal main resonance and the first shear harmonic wave is greater than the bandwidth of the longitudinal main resonance of the resonator.

7. The BAW resonator of claim 1, wherein the acoustic reflector includes a first layer with low acoustic impedance, a second layer with high acoustic impedance, a third layer with low acoustic impedance, a fourth layer with high acoustic impedance, and a fifth layer with low acoustic impedance.

8. The BAW resonator of claim 7, wherein the layers with low acoustic impedance are $SiO_2$ layers, wherein the layers with high acoustic impedance are W layers.

9. The BAW resonator of claim 7, comprising the layer sequence given in the following table

| Layer no. | Material | Layer thickness rel. to $\lambda_{long}$ |
|---|---|---|
| 112 | SiO2 | 0.770 |
| 114 | Tungsten | 0.175 |
| 116 | SiO2 | 0.250 |
| 118 | Tungsten | 0.245 |
| 120 | SiO2 | 0.180 |
| 106a | Aluminum | 0.130 |
| 106b | Tungsten | 0.070 |
| 102 | AlN | 0.220 |
| 104a | Tungsten | 0.028 |
| 104b | Aluminum | 0.080 to 0.12 |
| 104c | SiN | 0.008 | wherein the layer thicknesses are indicated relative to the longitudinal wavelengths $\lambda_{long}$ in the respective layer, and
wherein deviations from these thicknesses have to be smaller than 20%.

10. Filter circuit with a plurality of BAW resonators each of which comprises:
   a piezoelectric layer with a first surface and a second surface opposing the first surface;
   a first electrode disposed on the first surface of the piezoelectric layer;
   a second electrode disposed on the second surface of the piezoelectric layer;
   a substrate; and
   an acoustic reflector disposed between the substrate and the second electrode, the acoustic reflector comprising a plurality of layers from a material with high acoustic impedance and from a material with low acoustic impedance, wherein areas with layers with high acoustic impedance and areas with layers with low acoustic impedance are alternately adjacently disposed,
   wherein the performance of the acoustic reflector is determined by its reflectivity for a longitudinal wave existing in the BAW resonator at the resonance frequency of the BAW resonator and by its reflectivity for a shear wave existing in the BAW resonator at the resonance frequency of the BAW resonator, and wherein the layers of the acoustic reflector and layers disposed between the acoustic reflector and the piezoelectric layer are selected, with reference to their number, material, and thickness, such that the transmissivity for the longitudinal wave and the transmissivity for the shear wave in the area of the resonance frequency is smaller than −10 dB.

11. The filter circuit of claim 10, wherein the resonator elements and the acoustic reflectors of the plurality of BAW resonators are formed on a common substrate.

* * * * *